(12) United States Patent
Lin et al.

(10) Patent No.: US 12,256,512 B2
(45) Date of Patent: Mar. 18, 2025

(54) LOCKING ASSEMBLY AND CHASSIS

(71) Applicant: Fulian Precision Electronics (Tianjin) Co., LTD., Tianjin (CN)

(72) Inventors: Chieh-Hsiang Lin, New Taipei (TW); Jia-Feng Lin, New Taipei (TW)

(73) Assignee: Fulian Precision Electronics (Tianjin) Co., LTD., Tianjin (CN)

(*) Notice: Subject to any disclaimer, the term of this patent is extended or adjusted under 35 U.S.C. 154(b) by 147 days.

(21) Appl. No.: 18/215,148

(22) Filed: Jun. 27, 2023

(65) Prior Publication Data

US 2023/0422421 A1 Dec. 28, 2023

(30) Foreign Application Priority Data

Jun. 28, 2022 (CN) .......................... 202210754189.8

(51) Int. Cl.
*H05K 7/14* (2006.01)
(52) U.S. Cl.
CPC .................... *H05K 7/1402* (2013.01)
(58) Field of Classification Search
CPC .................................................. H05K 7/1402
USPC ....................................................... 361/801
See application file for complete search history.

(56) References Cited

U.S. PATENT DOCUMENTS

| | | | |
|---|---|---|---|
| 6,939,319 B1* | 9/2005 | Anstead | A61M 5/30 604/72 |
| 8,848,378 B2* | 9/2014 | Liao | H05K 7/1489 248/224.8 |
| 9,629,459 B2* | 4/2017 | Chen | A47B 88/427 |
| 10,255,952 B1* | 4/2019 | Han | G06F 1/187 |
| 10,368,460 B1* | 7/2019 | Yang | H05K 7/1411 |
| 2004/0008497 A1* | 1/2004 | Barringer | H05K 7/1461 361/759 |
| 2013/0200672 A1* | 8/2013 | Mo | B60N 2/2887 297/256.16 |
| 2020/0281086 A1* | 9/2020 | Wang | G11B 33/124 |
| 2021/0274667 A1* | 9/2021 | Lin | H05K 7/1401 |

* cited by examiner

*Primary Examiner* — Zhengfu J Feng
(74) *Attorney, Agent, or Firm* — ScienBiziP, P.C.

(57) ABSTRACT

A locking assembly for locking a second component to a second component, comprising a stopper, a mounting component, a driving component, and a linkage mechanism. The stopper is configured for connecting to the first component. The mounting component is configured for connecting to the second component. The driving component is slidably connected to the mounting component. A sliding slot is defined on the driving component. The sliding slot includes a locking segment. The linkage mechanism is slidably connected to the mounting component and the driving component. The linkage mechanism includes a first member and a connecting column. The first member includes a first part and a second part coupled to the first part. The first part is coupled to the mounting component, a first slot is defined on the second part. The connecting column is accommodated in the sliding slot and the first slot.

20 Claims, 8 Drawing Sheets

LOCKING ASSEMBLY AND CHASSIS

CROSS-REFERENCE TO RELATED APPLICATIONS

This application claims priority to Chinese Patent Application No. 202210754189.8 filed on Jun. 28, 2022, filed in China National Intellectual Property Administration, the contents of which are incorporated by reference herein.

FIELD

The subject matter herein generally relates to computer devices, and more particularly to a locking assembly and a chassis.

BACKGROUND

A data storage module is usually fixed in a chassis of a computer by a mounting bracket. The data storage module can be a hard disk, a floppy drive or an optical drive to store data for the computer. The data storage module is fixed to the mounting bracket, and the chassis and the mounting bracket are secured by screws.

When the chassis and the mounting bracket need to be separated, the screws need to be removed one by one with the help of a screwdriver results a tediously process. Moreover, it is difficult to store the screws. If some of the screws are lost, it is difficult to reassemble the chassis and the mounting bracket.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

The term "coupled" is defined as connected, whether directly or indirectly through intervening components, and is not necessarily limited to physical connections. The connection can be such that the objects are permanently connected or releasably connected. The term "comprising" means "including, but not necessarily limited to".

Without a given definition otherwise, all terms used have the same meaning as commonly understood by those skilled in the art. The terms used herein in the description of the present disclosure are for the purpose of describing specific embodiments only, and are not intended to limit the present disclosure.

Figure 1:
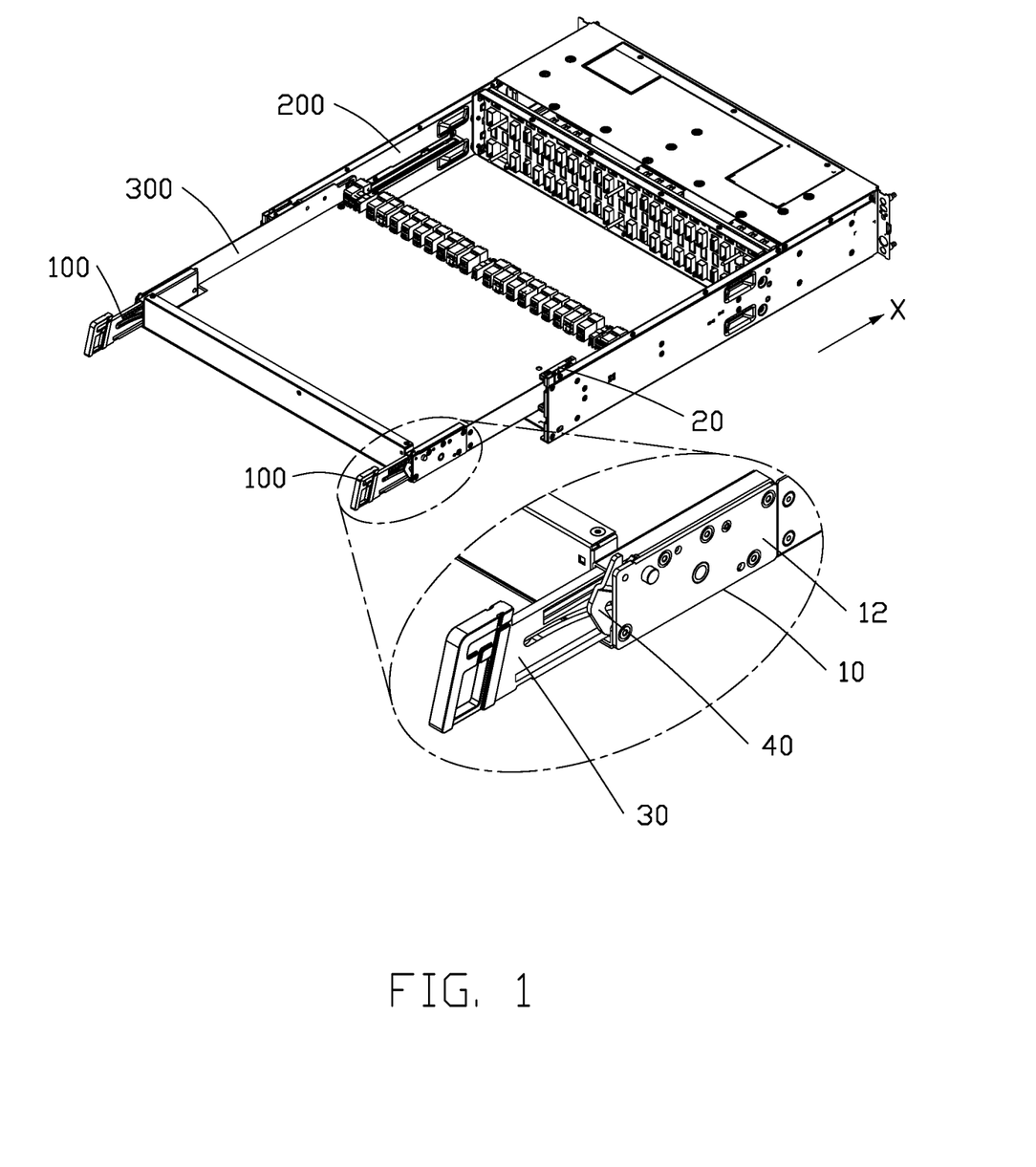
FIG. 1 is an isometric, assembled view of a first component and a second component of a chassis in an embodiment of the present application.
Figure 8:
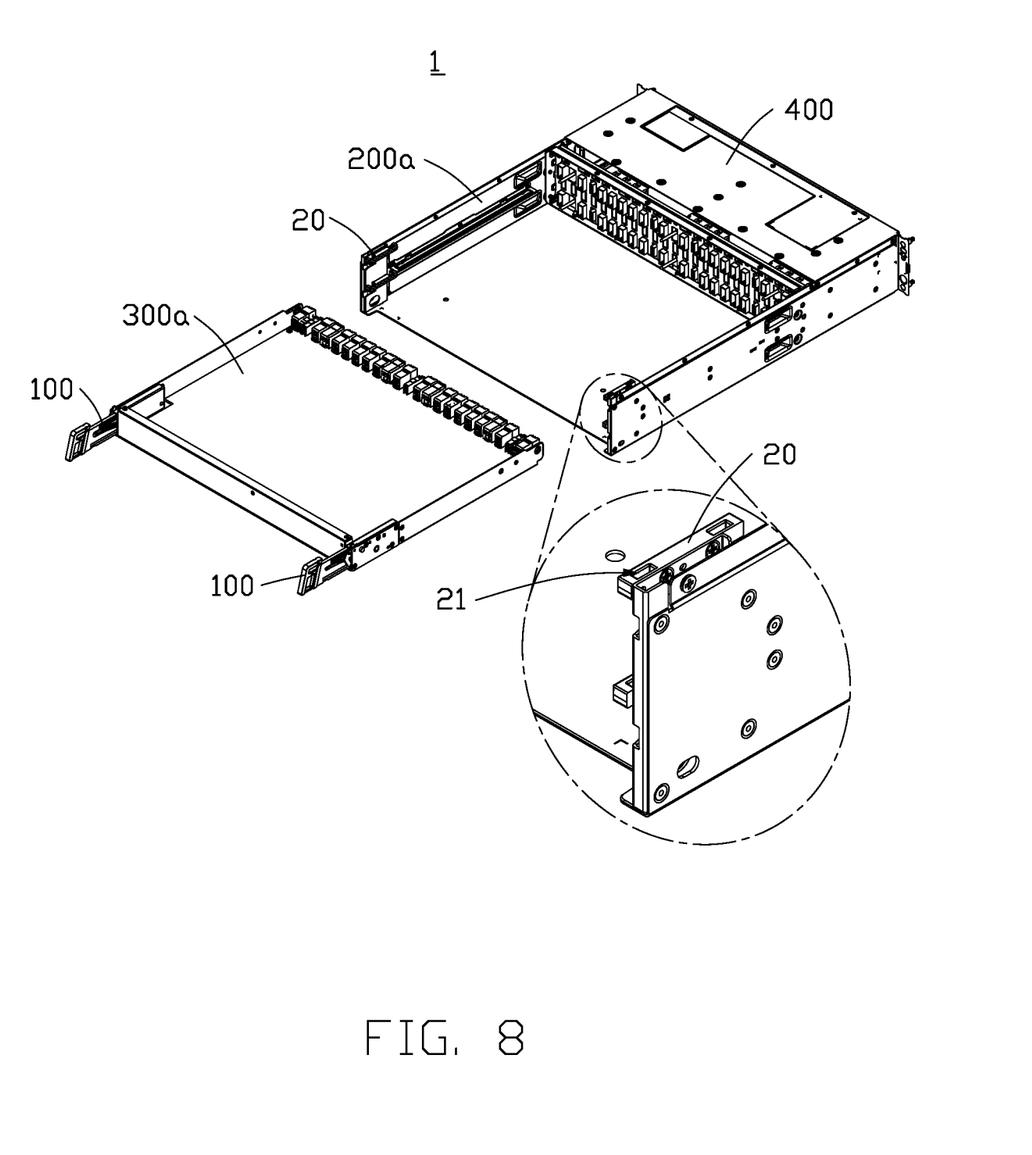
FIG. 8 is an isometric view of the chassis of FIG. 1.

As shown in FIGS. 1 and 8, a chassis 1 of an embodiment comprises a locking assembly 100, a first component 200 and a second component 300. The locking assembly 100 comprises a stopper 20, a mounting component 10, a driving component 30, and a linkage mechanism 40. The locking assembly 100 is configured to secure the second component 300 to the first component 200 in a sliding direction X. The stopper 20 is coupled to the first component 200 for stopping the movement of the linkage mechanism 40. The mounting component 10 is coupled to the second component 300. The driving component 30 is slidably coupled to the mounting component 10 for driving the linkage mechanism 40. The linkage mechanism 40 is positioned between the mounting component and the driving component 30. The linkage mechanism 40 is further movably coupled to the driving component 30. When the driving component 30 drives the linkage mechanism 40 to act on the stopper 20, the first component 200 can be locked with the second component 300.

The first component 200 can be a chassis with cavity. The second component 300 can be a drawer compatible with the chassis.

In some embodiments, the stopper 20 is located at the front side of the first component 200. The mounting component 10 is located at the front side of the second component 300. When the second component 300 is secured to the first component 200 along the sliding direction X, the stopper 20 can restrict the movement of the mounting component 10 by stopping the linkage mechanism 40. The stopper 20 can also be located at other locations on the first component, and the mounting component 10 can also be located at other locations on the second component 300. The stopper 20 is configured for restricting the movement of the mounting component 10 by stopping the linage structure 40, when the second component 300 is locked with the first component 200.

Figure 2:
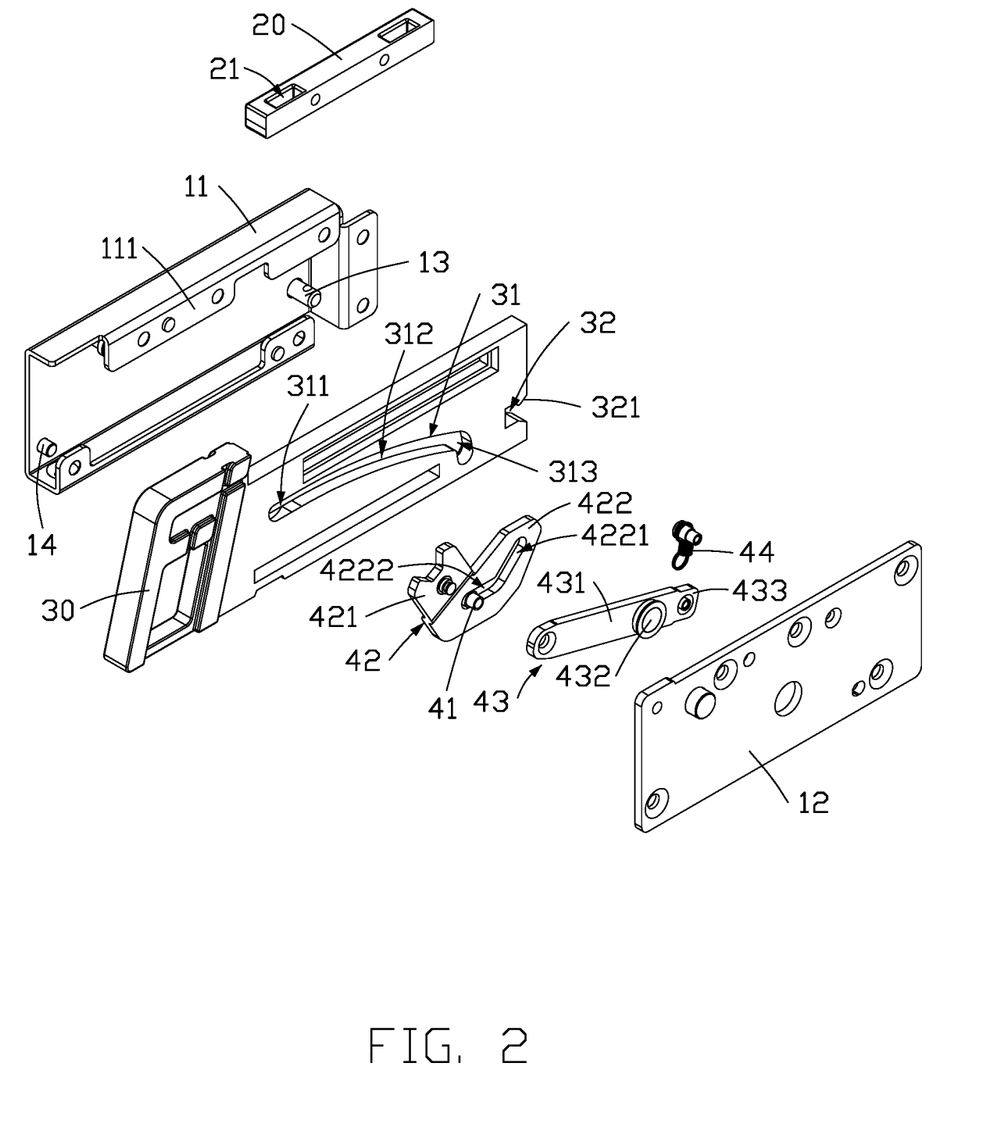
FIG. 2 is an exploded view of a locking assembly of the chassis of FIG. 1.

As shown in FIG. 2, a locking hole 21 is defined on the stopper 20. The locking hole 21 is located at one end of the stopper 20 for accommodating some parts of the linkage mechanism 40 and restricting the movement of the linkage mechanism 40. In some embodiments, the locking hole 21 can be a through-hole, and the top side of the linkage mechanism 40 can pass through the limit hole 21.

The mounting component 10 comprises a first mounting section 11 and second mounting section 12. The first mounting section 11 is detachably coupled to the second mounting section 12. The first mounting section 11 is coupled to the driving component 30. The second mounting section 12 is coupled to the linkage mechanism 40. The driving component 30 and the linkage mechanism 40 are located between the first mounting section 11 and the second mounting section 12. The second mounting section 12 can be detachably mounted on the second component 300, so that the drive component 30, the linkage mechanism 40, and the mounting component 10 can be integrally mounted to the second component 300.

In some embodiments, the first mounting section 11 can be coupled to the second mounting section 12 with bolts. The mounting component 10 can be mounted to the second component 300 with bolts.

In some embodiments, the material of the mounting component 10 can be metal or rigid plastic.

Figure 3:
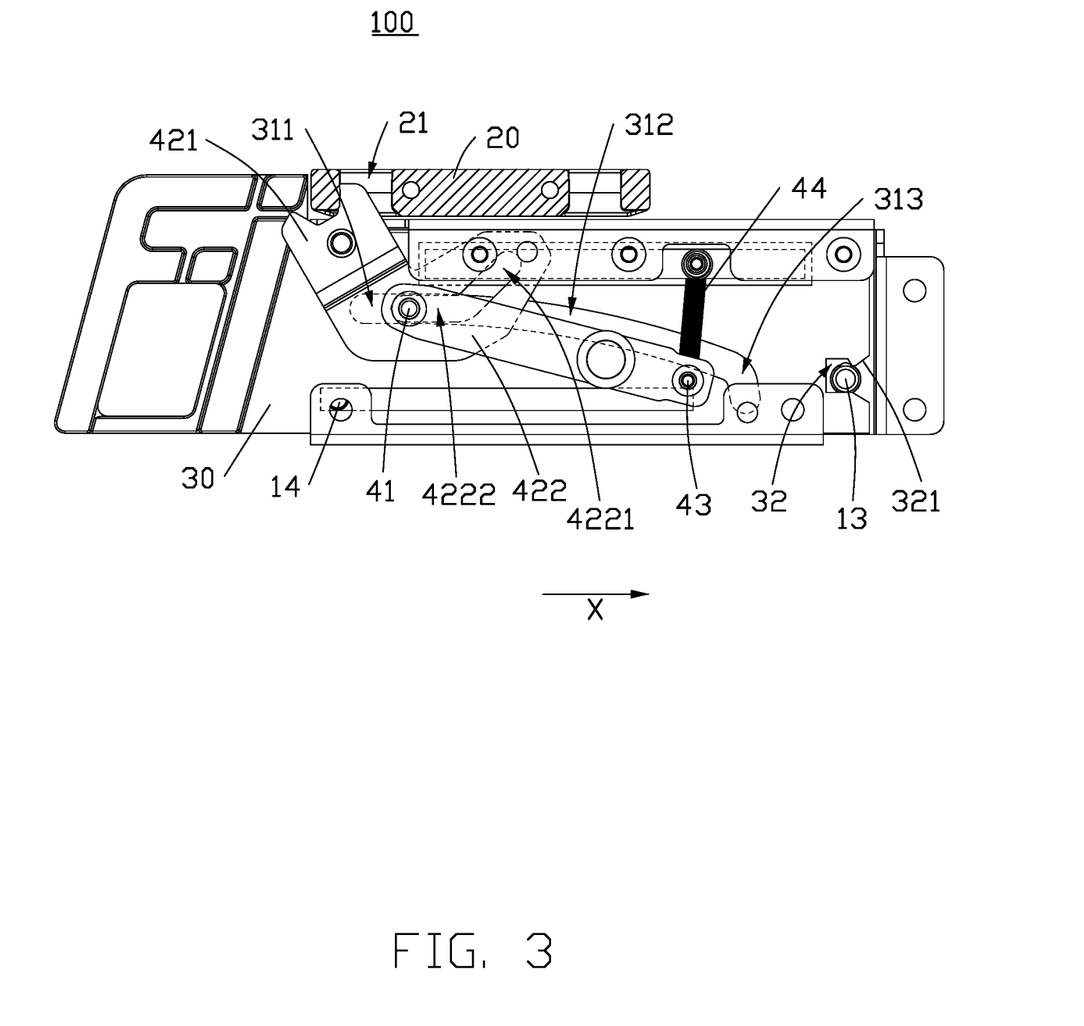
FIG. 3 is another assembled view of the locking assembly of the chassis in FIG. 2.

As shown in FIGS. 2 and 3, the mounting component 10 further comprises a limiting section 13. The limiting section 13 is coupled to the first mounting section 11 at the rear side of the first mounting section 11. The limiting section 13 is configured to restrict the movement of the driving component 30 for keeping the position of the driving component 30 and the first mounting section 11. In some embodiments, the limiting section 13 can be a circular or square column made of elastic materials such as rubber.

The mounting component 10 further comprises two guiding sections 14. Each of the guiding sections 14 is coupled to the first mounting section 11 for guiding the driving component 30. The two guiding sections 14 are set in parallel. The two guiding sections 14 are configured to guide the driving component 30 to move in a substantially straight direction.

The first mounting section 11 comprises a protective plate 111. The protective plate 111, the guiding section 14, and the limiting section 13 are positioned on the same side of the first mounting section 11. The protective plate 111 is configured to protect the driving component 30. When the driving component 30 is mounted on the first mounting section 11, the driving component 30 is located on the side of the protective plate 111 closer to the guiding sections 14 for preventing the driving component 30 from leaning towards the second mounting section 12 during movement.

As shown in FIGS. 1 and 2, a sliding slot 31 is defined on the driving component 30. The sliding slot 31 is approximately located in the middle of the driving component 30. The sliding slot 31 includes a limiting segment 311, a sliding segment 312, and a locking segment 313. The sliding segment 312 is located between the limiting segment 311 and the locking segment 313, and the sliding section 312 is in communication with the limiting section 311 and the locking section 313. The locking segment 313 is configured to restrict the movement of the linkage mechanism 40. When the driving component 30 is pulled out from the mounting component 10 and restricted by the linkage mechanism 40, the linkage mechanism 40 is driven to a position corresponding to the locking segment 313.

As shown in FIG. 2, the locking segment 313 is a curved slot with an axis of the curved slot located on a side of the curved slot towards the sliding segment 312. The linkage mechanism 40 can be restricted by the inner wall of the locking segment 313.

The limiting segment 311 is located at the front side of the driving component 30 for restricting the rotation of the linkage mechanism 40.

In some embodiments, the limiting segment 311 extends along a straight line parallel to the direction of movement of the driving component 40. When the driving component 40 is moving along the extension of the limiting segment 311, the inner wall of the limiting segment will not rotate the linkage mechanism 40.

The sliding segment 312 is inclined to the direction of movement of the driving component 40 for rotating the linkage mechanism 40.

In some embodiments, the sliding segment 312 is downward inclined along the direction of pushing the driving component 30 into the mounting component 10.

A notch 32 is defined on the driving component 30. The notch is located at the rear side of the driving component 30 in the sliding direction X for accommodating the limiting section 13. When the limiting section 13 is accommodated in the notch 32, the movement of the driving component 30 and the mounting component 10 along the sliding direction X are restricted.

In some embodiments, the notch 32 has an opening towards the limiting section 13. The opening of the notch 32 is provided with a closing 321, so that the size of the opening is smaller than the diameter of the limiting section 13 before deformed by force. The closing can keep the limiting section 13 in the notch 32 for restricting the movement of the driving component 30 and the mounting component 10 along the sliding direction X.

Figure 4:
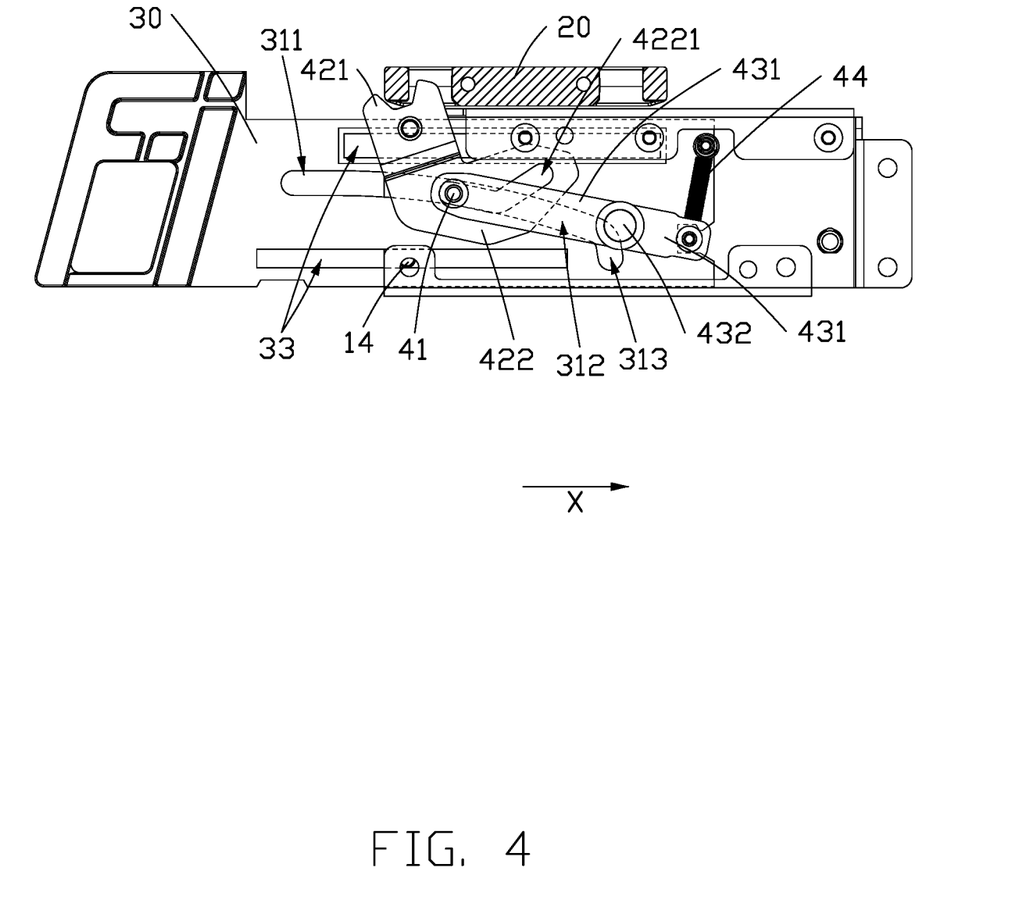
FIG. 4 is another assembled view of the locking assembly of the chassis in FIG. 2, a driving component is pulling out from a mounting component.

As shown in FIGS. 3 and 4, two guiding slots 33 are defined on the driving component 30. Each of the two guiding slots 33 extends along the sliding direction X. The sliding slot 31 is located between the two guiding slots 33 along a direction perpendicular to the movement of the driving component 30. Each of the two guiding sections 14 extends into one of the two guiding slots 33. Each of the two guiding sections 14 is slidably coupled to one of the two guiding slots 33 for guiding the driving component 30 to move in the sliding direction X.

As shown in FIG. 2, the linkage mechanism 40 comprises a connecting column 41 and a first member 42. The connection column 41 is cylindrical. The connecting column 41 is slidably coupled to the first member 41. The connecting column 41 further extends into the limiting slot 31, and can be slid in the direction of the extension of the limiting slot 31. When the connecting column 41 is accommodated in the limiting slot 31, the first member 42 can be guided by the cooperating of the connecting column 41 and the limiting slot 31. The first member 42 is configured to restrict the movement between the first component 200 and the second component by the first member 42 acting on the stopper 20.

The first member 42 comprises a first part 421 and a second part 422. The first part 421 is rotatably coupled to the second mounting section 12. The second part 422 is coupled to the connecting column 41 for driving the connecting column slide into or out the locking segment 313.

In some embodiments, the second part 422 extends in an acute angle to the first part from the end area of the first part 421 for reducing the size of the first member 42.

Figure 5:
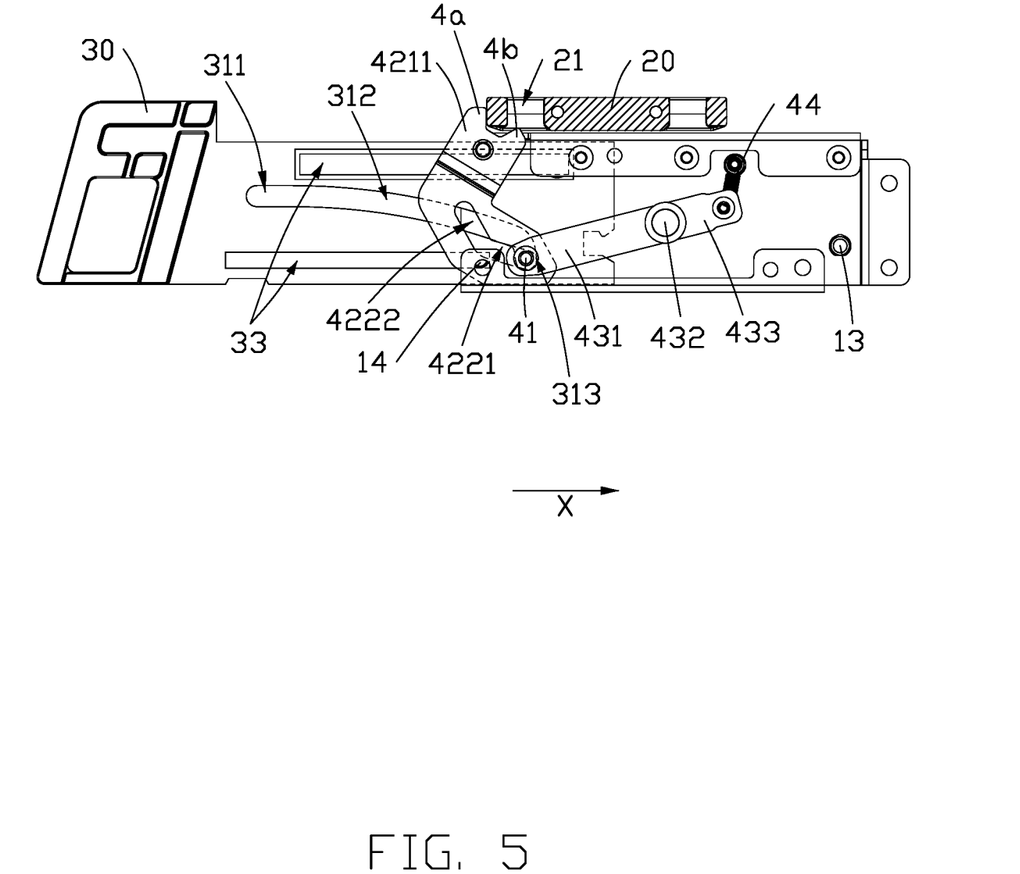
FIG. 5 is another assembled view of the locking assembly of the chassis in FIG. 4, the driving component is continuously pulled out from the mounting component.

As shown in FIGS. 4 and 5, the first part 421 comprises a locking body 4211. The locking body 4211 extends in a direction away from the second part 422. The locking body 4211 can be inserted into the locking hole 21 on the stopper 20 for restricting the rotation of the first member 42 by acting on the stopper 20. When the second component 300 is locked with the first component 200, the locking body 4211 is inserted into the locking hole 21 and acted on the stopper 20 for restricting the movement of the second component 300 and the first component 200.

In some embodiments the locking body 4211 comprises a first bulge 4a and a second bulge 4b. The first bulge 4a and the second bulge 4b are spaced apart. The first bulge 4a is configured to act on the front side of the stopper 20. The stopper 20 can force on the first bulge 4a and rotate the first member 42. When the first component 200 is inserted into the second component 300, the second bulge 4b is inserted into the locking hole 21 for restricting the movement of the mounting component 10 along the sliding direction X.

In some embodiments, a first slot 4221 is defined on the second part 422. The connecting column 41 is positioned within the sliding slot 31 and the first slot 4221, so that the connecting column 41 is slidably connected to the driving component 30 and the first member 42.

Figure 6:
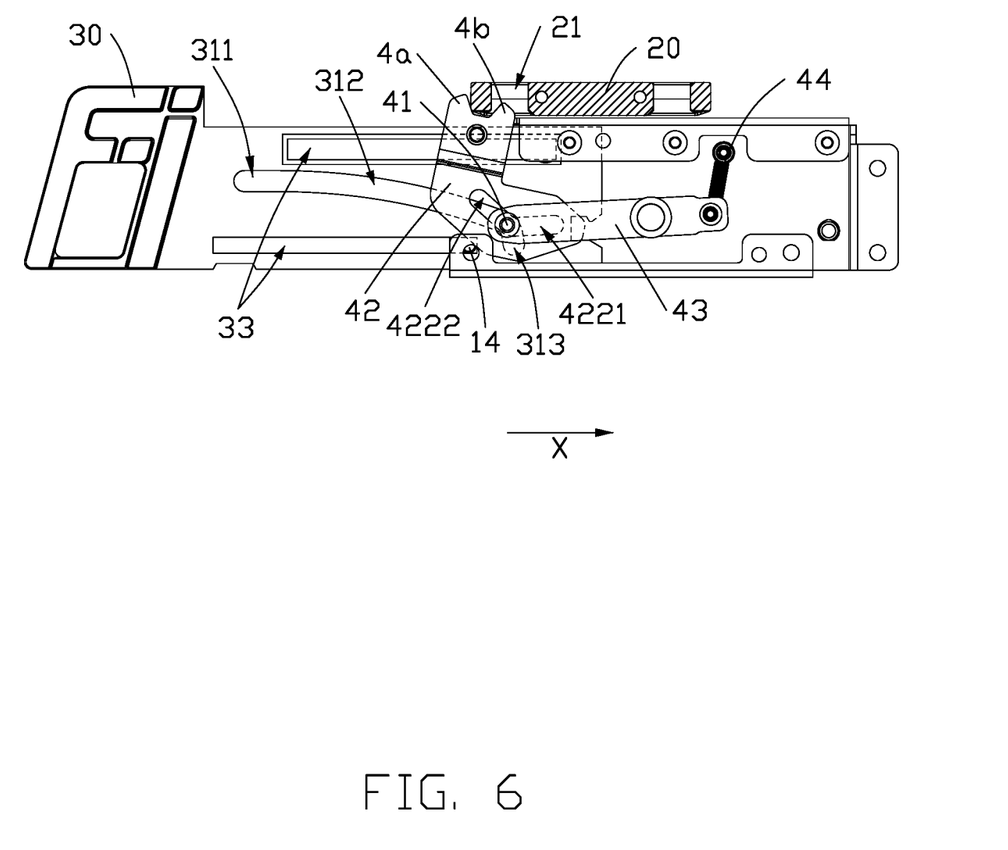
FIG. 6 is another assembled view of the locking assembly of the chassis in FIG. 4, the driving component is pushing into the mounting component.

As shown in FIGS. 4 and 5, a second slot 4222 is defined on the second part 422. The second slot 4222 and the first slot 4221 are continuous. The connecting column 41 can slide from the first slot 4221 to the second slot 4222. When the connecting column 41 slides into the locking segment 313, and located at the end of the first slot 4221 away from the second slot 4222, the second part 422 can be driven away from the locking segment 313 by the rotation of the first member 42, and the connecting column 41 can be driven from the end of the first slot 4221 to the second slot 4222. As shown in FIG. 6, as the connecting column 41 slides from the first slot 4221 to the second slot 4222, the inner wall of the first slot 4221 can generate a force to pull the connecting column 41 out of the locking segment 313 until the connecting column 41 located at a position between the first slot 4221 and the second slot 4222. The connecting column 41 can be driven out of the locking segment by the first member 42. When the connecting column 41 is driven out of the locking segment 313, the restriction of the locking segment 313 and the connecting column 41 is disengaged. The restriction on the side wall of the locking segment 313 to the connecting column 41 can be lifted by pulling the connecting column 41 directly outward toward the locking segment 313 through the first slot 4221.

In some embodiments, the first slot 4221 extends along a straight line for reducing the resistance of the first slot 4221 to the movement of the connecting column 41. The second slot 4222 extends along a straight line. When the connecting column 41 moves on the sliding segment 312, the second slot 4222 gradually rotates to parallel or tangential to the sliding segment 312, reducing the side wall of the second slot 4222 that obstructs the movement of the connecting column 41 in the sliding segment 312.

Figure 7:
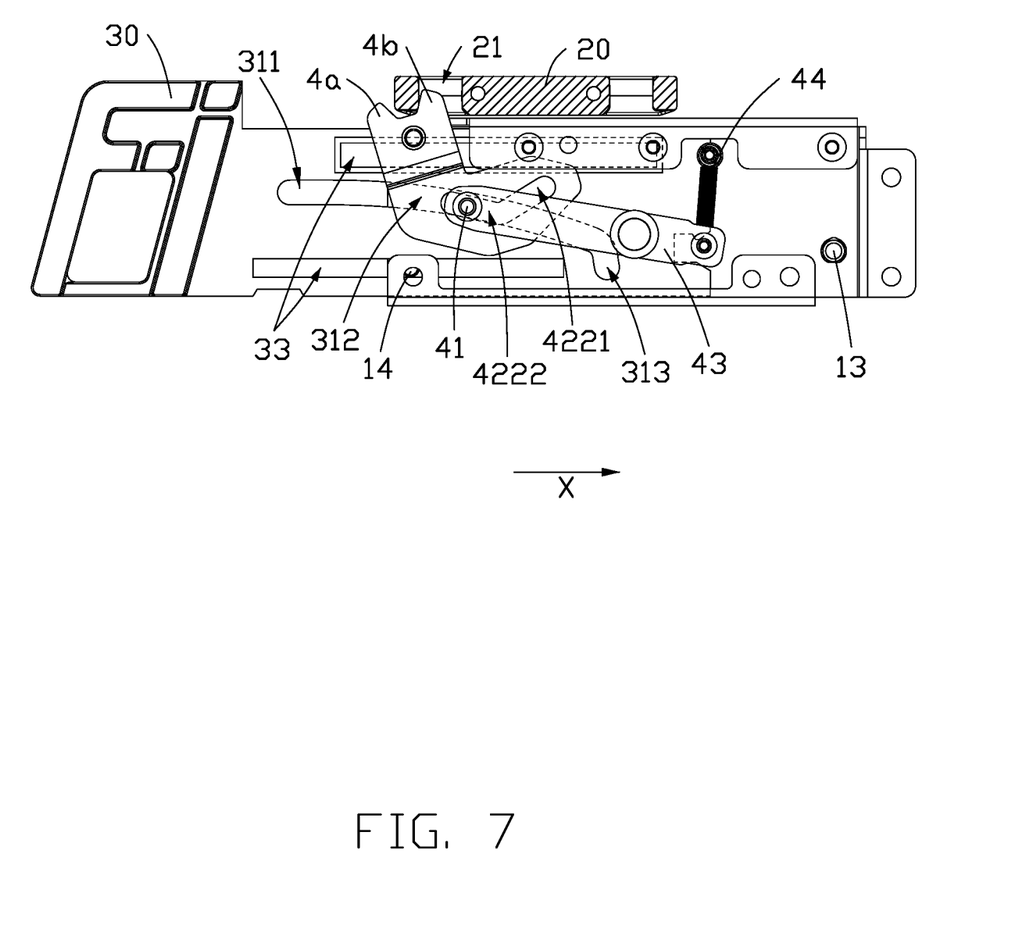
FIG. 7 is another assembled view of the locking assembly of the chassis in FIG. 6, the driving component is continuously pushed into the mounting component.

As shown in FIG. 7, when the connecting column 41 slides into the limiting segment 311, the second slot 4222 is parallel to the limiting segment 311. The stopper 20 restricts the rotation of the first member 42. When the driving component 30 is driven relative to the mounting component 10 along the sliding direction X, the connecting column 41 slides in the limiting segment 311. Since the limiting segment 311 extends along a straight line, the movement of the connecting column 41 within the limiting segment 311 will not cause the rotation of the first member 42, thereby preventing the first member 42 from being released from the restriction of the stopper 20.

As shown in FIGS. 2 and 5, the linkage mechanism 40 further comprises a second member 43 and an elastic member 44. The second member 43 and the elastic member 44 are connected to the second mounting section 12. The second member 43 is connected to the first member 42 and the elastic member 44. The elastic member 44 is configured to generate a torque on the second member 43 to restrict the connecting column within the locking segment 313.

In some embodiments, the second member 43 comprises a connecting part 431, a rotating part 432 and a restricting part 433. The rotating part 432 is connected to the connecting part 431 and the restricting part 433. The connecting column 41 is rotatably connected to the connecting part 431. The rotating part 432 is rotatably connected to the mounting component 10. One end of the elastic member 44 is coupled to the restricting part 433, another end of the elastic member 44 is coupled to the mounting component 10. When the connecting column 41 slides into the locking segment 313, the elastic member 44 can pull the restricting part 433. When the elastic member 44 pulls the restricting part 433, the rotating part 432 gets a tendency to rotate for driving the connecting part 431 away from the stopper 20, and the connecting column 41 can slide into the locking segment 313 for locking the position of the connecting column 41 and the mounting component 10.

The step of pulling the second component 300 out of the first component 200 along the sliding direction X comprises:

As shown in FIG. 3, the driving component 30 is pulled out from the mounting component 10, the notch 32 is unlocked from the limiting segment 13. The connecting column 41 can be maintained within the limiting segment 311, and the driving component 31 can drive the limiting segment 311 forward relative to the connecting column 41.

As shown in FIGS. 4 and 7, the driving component 30 continues to be pulled out from the mounting component 10, the connecting column 41 slides into the sliding segment 312. As the sliding segment 312 is set at an angle relative to the direction of the movement of the driving member 10, the connecting column 41 can move away from the stopper 20 by the guiding of the sliding segment 312. The connecting column 41 rotates the first member 42, while the second bulge 4b can be disengaged from the locking hole 21. When the second bulge 4b disengages from the locking hole 21, the second member rotates.

As shown in FIG. 5, the driving component 30 continues to be pulled out from the mounting component 10, the connecting column 41 can slide into the bottom end of the locking segment 313, and the connecting column 41 can be restricted in the locking segment 313 for preventing the driving component 30 from pulling out from the mounting component 10 or pushing into the mounting component 10. The second bulge 4b is completely removed from the locking hole 21, and the restriction of the stopper 20 on the mounting member 10 is released, and the second component 300 can be detached from the first component 200.

The step of pushing the second component 300 into the first component 200 along the sliding direction X comprises:

As shown in FIG. 5, the first component 200 is pushed into the second component 300 by the driving component 30. When the first bulge 4a touches the stopper 20, the stopper 20 rotates the first member 20. The connecting column 41 slides out from the locking segment 313 by the guiding of the first slot 4221, and the driving component 30 can continue to be pushed into the mounting component 10. As shown in FIGS. 6 and 7, when the second bulge 4b enters the locking hole 21, the connecting column 41 can be completely slid out of the locking segment 313. When the connecting column 41 is slid out of the locking segment 313, the connecting column 41 can be slid into the second slot 4222 and sliding segment 312 in sequence.

As shown in FIGS. 2 and 7, the driving component 30 continues to be pushed into the mounting component 10, the connected column 41 slides into the front side of the second slot 4222 and the front side of the sliding segment 412. As the connecting column 41 touches the end of the second slot 4222 and slides into the limiting segment 411, the second bulge 4b enters the locking hole 21. The driving component 30 is restricted in the mounting component 10 by the cooperation of the limiting section 13 and the notch 32.

As shown in FIG. 8, the first component 200 can be a housing 200a with a first cavity. The first cavity is configured to accommodate a first module. The second component 300 can be a drawer 300a with a second cavity. The second cavity is configured to accommodate a second module. The first module can be an HDD module 400 (hard disk drive module). The second module can be a memory module. The HDD module 400 can be electrically connected to the memory module.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including, the full extent established by the broad general meaning of the terms used in the claims.

What is claimed is:

1. A locking assembly for locking a second component to a first component, comprising:
   a stopper configured for connecting to the first component;
   a mounting component configured for connecting to the second component;
   a driving component slidably connected to the mounting component, and a sliding slot is defined on the driving component, the sliding slot comprising a locking segment; and
   a linkage mechanism slidably connected to the mounting component,
   wherein the driving component comprises:
      a first member comprises a first part and a second part, the second part is coupled to the first part, the first part is coupled to the mounting component, a first slot is defined on the second part, and
      a connecting column is accommodated in the sliding slot and the first slot,
   when the driving component is pulled out from the mounting component along a sliding direction, the first part is configured to rotate around the stopper for driving the second part to move away from the stopper, and driving the connecting column to slide into the locking segment by guiding of the first slot, and
   when the driving component is pushed into the mounting component opposite to the sliding direction, the first part is configured to rotate around the stopper for driving the second part to move towards the stopper, and driving the connecting column to slide out from the locking segment by guiding of the first slot.

2. The locking assembly of claim 1, wherein:
a locking hole is defined on the stopper, the first part comprises a locking body, and
the locking body is configured to be accommodated in the locking hole for locking the first component and the second component.

3. The locking assembly of claim 1, wherein:
the sliding slot further includes a limiting segment, and
the limiting segment extends along a direction parallel to the sliding direction.

4. The locking assembly of claim 3, wherein:
the sliding slot further includes a sliding segment, and
the sliding segment is set at an angle to the sliding direction, and the sliding segment is connected to the limiting segment and the locking segment.

5. The locking assembly of claim 4, wherein:
the locking segment is a curved slot with an axis of the curved slot located on a side of the curved slot towards the sliding segment.

6. The locking assembly of claim 1, wherein:
a second slot is defined on the second part, and
the second slot is connected to the first slot.

7. The locking assembly of claim 1, wherein:
the linkage mechanism comprises a second member and an elastic member,
the second member comprises a connecting part, a rotating part, and a restricting part,
the rotating part is connected to the connecting part and the restricting part,
the connecting part is rotatably connected to the connecting column and rotatably connected to the mounting component, and
one end of the elastic member is coupled to the restricting part, another end of the elastic member is coupled to the mounting component.

8. The locking assembly of claim 1, wherein:
the mounting component comprises two guiding sections,
two guiding slots are defined on the driving component,
each of the two guiding slots extends along the sliding direction, and
each of the two guiding sections is slidably coupled to one of the two guiding slots.

9. The locking assembly of claim 1, wherein:
the mounting component comprises a limiting section,
a notch is defined on the driving component, and
the notch is configured to accommodate the limiting section for restricting the driving component moves relative to the mounting component along the sliding direction.

10. The locking assembly of claim 1, wherein:
the mounting component comprises a first mounting section and second mounting section, the first mounting section is detachably coupled to the second mounting section.

11. A locking assembly for locking a second component to a first component, comprising:
   a stopper configured for connecting to the first component;
   a mounting component configured for connecting to the second component;
   a driving component slidably connected to the mounting component, and a sliding slot is defined on the driving component, the sliding slot comprising a locking segment; and
   a linkage mechanism slidably connected to the mounting component,
   wherein the driving component comprises:
      a first member comprises a first part and a second part, the second part is coupled to the first part, the first part is coupled to the mounting component, a first slot is defined on the second part, and a connecting column is accommodated in the sliding slot and the first slot, the connection column is cylindrical;

when the driving component is pulled out from the mounting component along a sliding direction, the first part is configured to rotate around the stopper for driving the second part to move away from the stopper, and driving the connecting column to slide into the locking segment by guiding of the first slot, and when the driving component is pushed into the mounting component opposite to the sliding direction, the first part is configured to rotate around the stopper for driving the second part to move towards the stopper, and driving the connecting column to slide out from the locking segment by guiding of the first slot.

12. The locking assembly of claim 11, wherein:
a locking hole is defined on the stopper, the first part comprises a locking body, and
the locking body is configured to be accommodated in the locking hole for locking the first component and the second component.

13. The locking assembly of claim 11, wherein:
the sliding slot further includes a limiting segment, and
the limiting segment extends along a direction parallel to the sliding direction.

14. The locking assembly of claim 13, wherein:
the sliding slot further includes a sliding segment, and
the sliding segment is set at an angle to the sliding direction, and the sliding segment is connected to the limiting segment and the locking segment.

15. The locking assembly of claim 14, wherein:
the locking segment is a curved slot with an axis of the curved slot located on a side of the curved slot towards the sliding segment.

16. The locking assembly of claim 11, wherein:
a second slot is defined on the second part, and
the second slot is connected to the first slot.

17. The locking assembly of claim 11, wherein:
the linkage mechanism comprises a second member and an elastic member,
the second member comprises a connecting part, a rotating part and a restricting part,
the rotating part is connected to the connecting part and the restricting part,
the connecting part is rotatably connected to the connecting column and rotatably connected to the mounting component, and
one end of the elastic member is coupled to the restricting part, another end of the elastic member is coupled to the mounting component.

18. The locking assembly of claim 11, wherein:
the mounting component comprises two guiding sections,
two guiding slots are defined on the driving component,
each of the two guiding slots extends along the sliding direction, and
each of the two guiding sections is slidably coupled to one of the two guiding slots.

19. The locking assembly of claim 11, wherein:
the mounting component comprises a limiting section,
a notch is defined on the driving component, and
the notch is configured to accommodate the limiting section for restricting the driving component move relative to the mounting component along the sliding direction.

20. A chassis, comprising:
a housing;
a drawer; and
a locking assembly comprising:
a stopper configured for connecting to the housing;
a mounting component configured for connecting to the drawer;
a driving component slidably connected to the mounting component, and a sliding slot is defined on the driving component, the sliding slot includes a locking segment; and
a linkage mechanism slidably connected to the mounting component and the driving component, the linkage mechanism comprising:
a first member comprising a first part and a second part, the second part is coupled to the first part, the first part is coupled to the mounting component, a first slot is defined on the second part; and
a connecting column accommodated in the sliding slot and the first slot,
wherein when the driving component is pulled out from the mounting component along a sliding direction, the first part is configured to rotate around the stopper for driving the second part to move away from the stopper, and driving the connecting column to slide into the locking segment by guiding of the first slot, and
when the driving component is pushed into the mounting component opposite to the sliding direction, the first part is configured to rotate around the stopper for driving the second part to move towards the stopper, and driving the connecting column to slide out from the locking segment by guiding of the first slot.

* * * * *